United States Patent
Lee et al.

(10) Patent No.: US 7,808,858 B2
(45) Date of Patent: Oct. 5, 2010

(54) METHOD AND CIRCUIT FOR DRIVING WORD LINE OF MEMORY CELL

(75) Inventors: Yun-sang Lee, Yongin-si (KR); Jung-bae Lee, Yongin-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 418 days.

(21) Appl. No.: 11/875,171

(22) Filed: Oct. 19, 2007

(65) Prior Publication Data

US 2008/0159055 A1 Jul. 3, 2008

(30) Foreign Application Priority Data

Dec. 27, 2006 (KR) .................. 10-2006-0135030

(51) Int. Cl.
*G11C 8/00* (2006.01)

(52) U.S. Cl. .............. 365/230.06; 365/203; 365/189.08

(58) Field of Classification Search ............ 365/230.06, 365/203, 189.08
See application file for complete search history.

(56) References Cited

U.S. PATENT DOCUMENTS 5,612,924 A * 3/1997 Miyamoto ............... 365/233.5
6,525,972 B2 * 2/2003 Yanagisawa ........... 365/189.09
6,545,923 B2 * 4/2003 Sim et al. .................. 365/204
6,859,386 B2 * 2/2005 Izutsu ........................ 365/154
2006/0044924 A1 * 3/2006 Wada et al. ............ 365/230.06

FOREIGN PATENT DOCUMENTS

| KR | 100205544 B1 | 4/1999 |
| KR | 100238868 B1 | 10/1999 |
| KR | 1020000051064 A | 8/2000 |
| KR | 1020060074982 A | 7/2006 |
| KR | 1020060117019 A | 11/2006 |

* cited by examiner

*Primary Examiner*—Son Dinh
(74) *Attorney, Agent, or Firm*—Volentine & Whitt, P.L.L.C.

(57) ABSTRACT

A method and circuit are provided for driving a word line. The word line driving circuit includes first and second power drivers, a switching unit and a word line driver. The first power driver is driven to a boosting voltage level and the second power driver is driven to an internal power voltage level. The switching unit transfers a first output of the first power driver to the word line driver in response to a first switching signal and transfers a second output of the second power driver to the word line driver in response to a second switching signal. The word line driver alternately drives a word line to the first output and the second output transferred from the switching unit in response to a word line driving signal.

14 Claims, 5 Drawing Sheets

METHOD AND CIRCUIT FOR DRIVING WORD LINE OF MEMORY CELL

CROSS-REFERENCE TO RELATED PATENT APPLICATION

A claim of priority is made to Korean Patent Application No. 10-2006-0135030, filed on Dec. 27, 2006, the subject matter of which is hereby incorporated by reference.

BACKGROUND OF THE INVENTION

1. Field of the Invention

The present invention relates to a semiconductor memory device, and more particularly, to a method and circuit for driving a word line of a memory cell.

2. Description of the Related Art

Semiconductor memory devices use a boosting voltage VPP to compensate for loss caused by a threshold voltage Vt of a transistor. The boosting voltage VPP is used for word line drivers. Word line drivers apply the boosting voltage VPP to a word line, write data of a bit line without the loss caused by the threshold voltage Vt of an NMOS cell transistor in a memory cell, and completely transfer cell data to the bit line during a reading operation.

FIG. 1 is a diagram illustrating operation of a conventional word line driving method. Referring to FIG. 1, when a word line WL is enabled to a boosting voltage level VPP, a bit line BL and a complementary bit line /BL are charge-shared based on data of a memory cell connected to the word line WL and developed.

In more detail, at a period A1, during which the word line WL is disabled, the bit line BL and the complementary bit line /BL are pre-charged to a voltage level $IVC_{array}/2$, corresponding to half of an internal power voltage $IVC_{array}$ used for a memory cell array block. At a period A2, during which the word line WL rises to the boosting voltage VPP level, for example, when the data of the memory cell has a logic high level, the bit line BL rises by about 100 mV from the voltage level $IVC_{array}/2$ and is charge-shared. At a period A3, during which the word line WL is fully enabled to the boosting voltage level VPP, the bit line BL is developed to a logic high level of the internal power voltage $IVC_{array}$, and the complementary bit line /BL is developed to a logic low level of a ground voltage VSS. Thereafter, at a period A4, the word line WL is disabled to the ground voltage level VSS.

The boosting voltage VPP is a high voltage level $IVC_{array}+Vt_{cell}+\alpha$, which is the sum of the internal power voltage $IVC_{array}$, a threshold voltage of a memory cell transistor $Vt_{cell}$, and a predetermined voltage $\alpha$. As indicated, the word line WL experiences high stress during the period A3.

Current semiconductor processing technology results in a micro memory cell transistor, having a then gate oxide film and a short gate of the micro memory cell transistor. When the boosting voltage VPP is applied to the word line WL connected to the gate of a conventional memory cell transistor, the stress caused by the high voltage level of the word line may result in a failure of the memory cell. Therefore, extended use of memory devices deteriorates long-term reliability.

Accordingly, the word line stress caused by the high voltage level can be reduced if the time during which the boosting voltage VPP is applied to the word line WL is shorter, for example, than that shown with respect to the word line period A3.

SUMMARY OF THE INVENTION

According to an aspect of the present invention, there is provided a method of driving a word line connected to memory cells. The method includes enabling the word line to a boosting voltage level during a first word line enable period, and enabling the word line to an internal power voltage level during at least one second word line enable period.

The word line may be enabled and data may be re-stored in the memory cells during the first word line enable period. The second word line enable period may include at least one word line enable period other than the first word line enable period. The method may further include applying a ground voltage to the word line during a word line disable period.

Also, the boosting voltage may include the sum of the internal power voltage and a threshold voltage of the memory cells. The internal power voltage may be used to drive array blocks in which the memory cells are arranged.

According to another aspect of the present invention, there is provided a method of driving a word line connected to memory cells. The method includes enabling the word line to a boosting voltage level during a first word line enable period; enabling the word line to an internal power voltage level during a second word line enable period; and enabling the word line to the boosting voltage level during a third word line enable period.

A bit line connected to the memory cells may be pre-charged and the word line may be disabled during the third word line enable period. The second word line enable period may be between the first word line enable period and the third word line enable period.

The method may further include enabling the word line to the boosting voltage level during at least a portion of the second word line enable period. The method may also include applying a ground voltage level to the word line during a word line disable period.

According to another aspect of the present invention, there is provided a word line driving circuit, including a first power driver, a second power driver, a switching unit and a word line driver. The first power driver is driven to a boosting voltage level and the second power driver is driven to an internal power voltage level. The switching unit transfers a first output of the first power driver to the word line driver in response to a first switching signal and transfers a second output of the second power driver to the word line driver in response to a second switching signal. The word line driver alternately drives a word line to the first output and the second output transferred from the switching unit in response to a word line driving signal.

The first power driver may include an inverter connected between a boosting voltage source and a ground voltage. The second power driver may include an inverter connected between an internal power voltage source and a ground voltage.

The switching unit may include a first PMOS transistor connected between the first power driver and the word line driver, and may have a gate connected to the first switching signal. The switching unit may also include a second PMOS transistor connected between the second power driver and the word line driver, and have a gate connected to the second switching signal.

The word line driving circuit may further include a first switching signal generator and a second switching signal generator. The first and second switching signal generators respectively generate the first switching signal and the second switching signal in response to an active signal, a word line enable signal, a sense AMP enable signal, a pre-charge signal, a word line disable signal, and a write enable signal.

The first switching signal generator may include a first NAND gate for inputting the active signal and the word line enable signal; a first NOR gate for inputting an output of the first NAND gate and the sense AMP enable signal; a second NAND gate for inputting the pre-charge signal, the word line disable signal, and the write enable signal; an inverter for inputting an output of the second NAND gate; and a second NOR gate for inputting outputs of the first NOR gate and the inverter, and outputting the first switching signal. The second switching signal generator may include a first NAND gate for inputting the active signal, the word line enable signal, and the sense AMP enable signal; an inverter for inputting an output of the first NAND gate; a second NAND gate for inputting the pre-charge signal, the word line disable signal, and the write enable signal; and a third NAND gate for inputting outputs of the inverter and the second NAND gate, and outputting the second switching signal.

The word line driver may include a PMOS transistor and an NMOS transistor. The PMOS transistor includes a gate connected to the word line driving signal, a source connected to an output of the switching unit, and a drain connected to the word line. The NMOS transistor includes a gate connected to the word line driving signal, a source connected to a ground voltage, and a drain connected to the word line.

BRIEF DESCRIPTION OF THE DRAWINGS

The embodiments of the present invention will be described with reference to the attached drawings, in which.

DETAILED DESCRIPTION OF THE EMBODIMENTS

Figure 1:
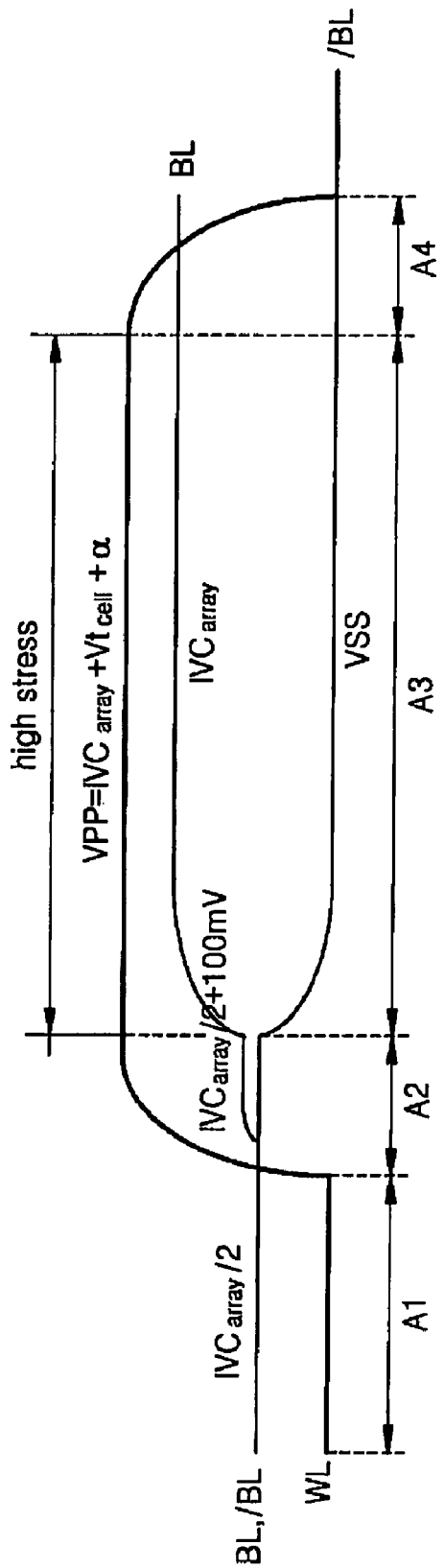
FIG. 1 is a diagram illustrating a conventional word line driving method.

The present invention will now be described more fully with reference to the accompanying drawings, in which exemplary embodiments of the invention are shown. The invention may, however, be embodied in various different forms, and should not be construed as being limited to the illustrated embodiments set forth herein; rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

Embodiments of the present invention provide a word line driving method to reduce stress on a word line at a high voltage. Embodiments also provide a word line driving circuit for implementing the word line driving method.

Figure 2:
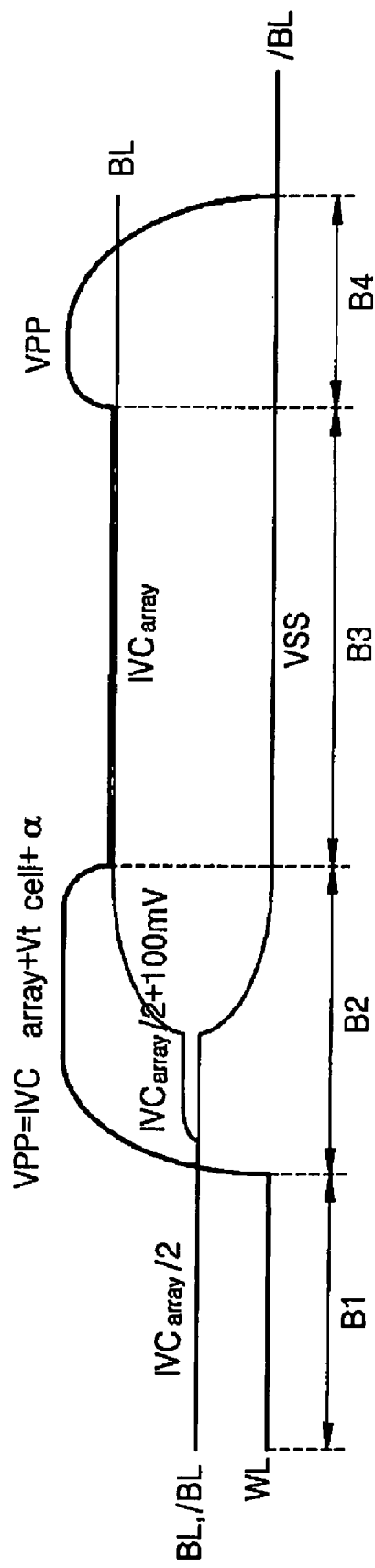
FIG. 2 is a diagram illustrating a word line driving method, according to an exemplary embodiment of the present invention.

FIG. 2 is a diagram illustrating a word line driving method, according to an exemplary embodiment of the present invention. Referring to FIG. 2, operation of a word line WL is divided into a word line WL disable period B1 and first through third word line enable periods B2, B3 and B4. The word line WL has a ground voltage level VSS during the word line WL disable period B1.

The word line WL rises to a boosting voltage level VPP and maintains the boosting voltage level VPP in the first word line enable period B2, during which the word line WL is enabled and the data of a memory cell is re-stored. While the word line WL is enabled and rising to the boosting voltage level VPP, for example, when the data of a memory cell has a logic high level during a reading operation, a bit line BL rises by about 100 mV from a voltage level $IVC_{array}/2$ and is charge-shared. In other words, during the first word line enable period B2, while the word line WL maintains the boosting voltage level VPP, the bit line BL rises to a logic high level of an internal power voltage $IVC_{array}$. Also, a complementary bit line /BL drops to a logic low level of the ground voltage VSS. The bit line BL having the logic high level is re-stored in the memory cell.

During the second word line enable period B3, the word line WL falls to the internal power voltage $IVC_{array}$ from the boosting voltage level VPP. However, the developed bit line BL maintains the logic high level and the developed complementary bit line /BL maintains the logic low level.

The word line WL again rises to the boosting voltage level VPP from the internal power voltage $IVC_{array}$ at the third word line enable period B4, during which the pair of bit lines BL and /BL is pre-charged and the word line WL is disabled. Since the word line WL rises to the boosting voltage level VPP again, for example, when the bit line BL has the logic high level and the complementary bit line /BL has the logic low level during a writing operation, the bit line BL having the logic high level is completely written to the memory cell without a voltage drop by a threshold voltage $Vt_{cell}$ of a memory cell transistor.

The word line driving method of the present embodiment may be applied when the data of the memory cell is read and the bit line BL is written to the memory cell. During the second word line enable period B3, where the word line WL falls to the internal power voltage $IVC_{array}$ from the boosting voltage level VPP, stress on the word line WL having a high voltage is reduced.

Figure 3:
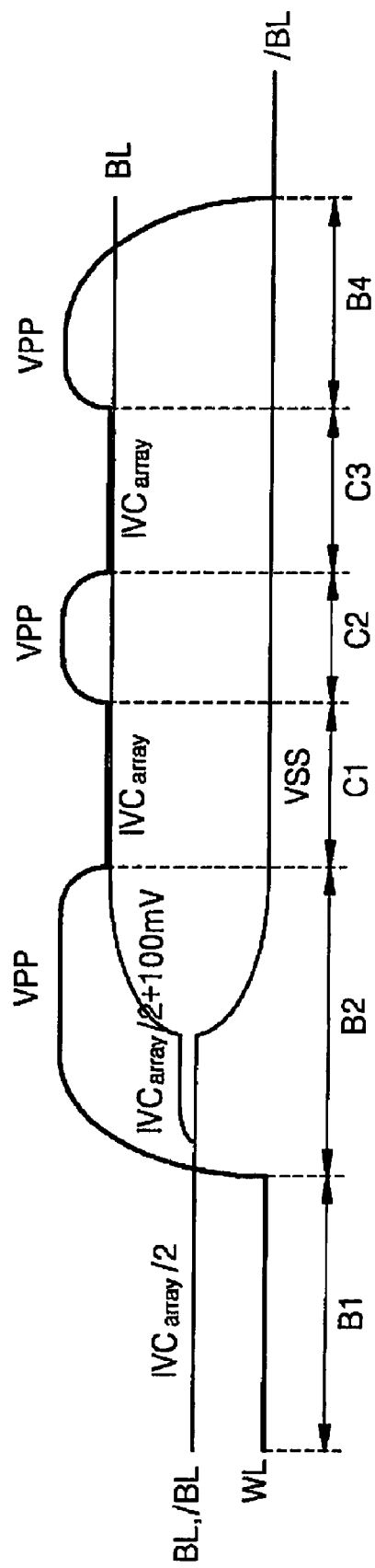
FIG. 3 is a diagram illustrating a word line driving method, according to another exemplary embodiment of the present invention.

FIG. 3 is a diagram illustrating a word line driving method, according to another exemplary embodiment of the present invention. The word line WL driving method of the depicted embodiment differs from the word line WL driving method of the embodiment illustrated in FIG. 2 in that the word line WL further includes a period C2, during which the word line WL rises to a boosting voltage level VPP again in the second word line enable period B3 (which includes word line enable periods C1, C2 and C3) where the word line WL is able to have an internal power voltage $IVC_{array}$.

During the period C2, where the word line WL rises to the boosting voltage level VPP again, the data of a memory cell has a logic high level, the bit line BL rises to a logic high level of the internal power voltage $IVC_{array}$, and the complementary bit line /BL drops to a logic low level of a ground voltage VSS during a reading operation. When the bit line BL has the logic high level and the complementary bit line /BL has the logic low level, the bit line BL having the logic high level is completely written to the memory cell without a voltage drop by a threshold voltage $Vt_{cell}$ of a memory cell transistor.

In the depicted embodiment, the word line WL has only one period C2 during which the word line WL rises to the boosting voltage level VPP again in a second word line enable period (e.g., second word line enable period B3). However, the present invention is not limited thereto and the word line WL can have multiple periods C2, without departing from the spirit and scope of the present invention.

Figure 4:
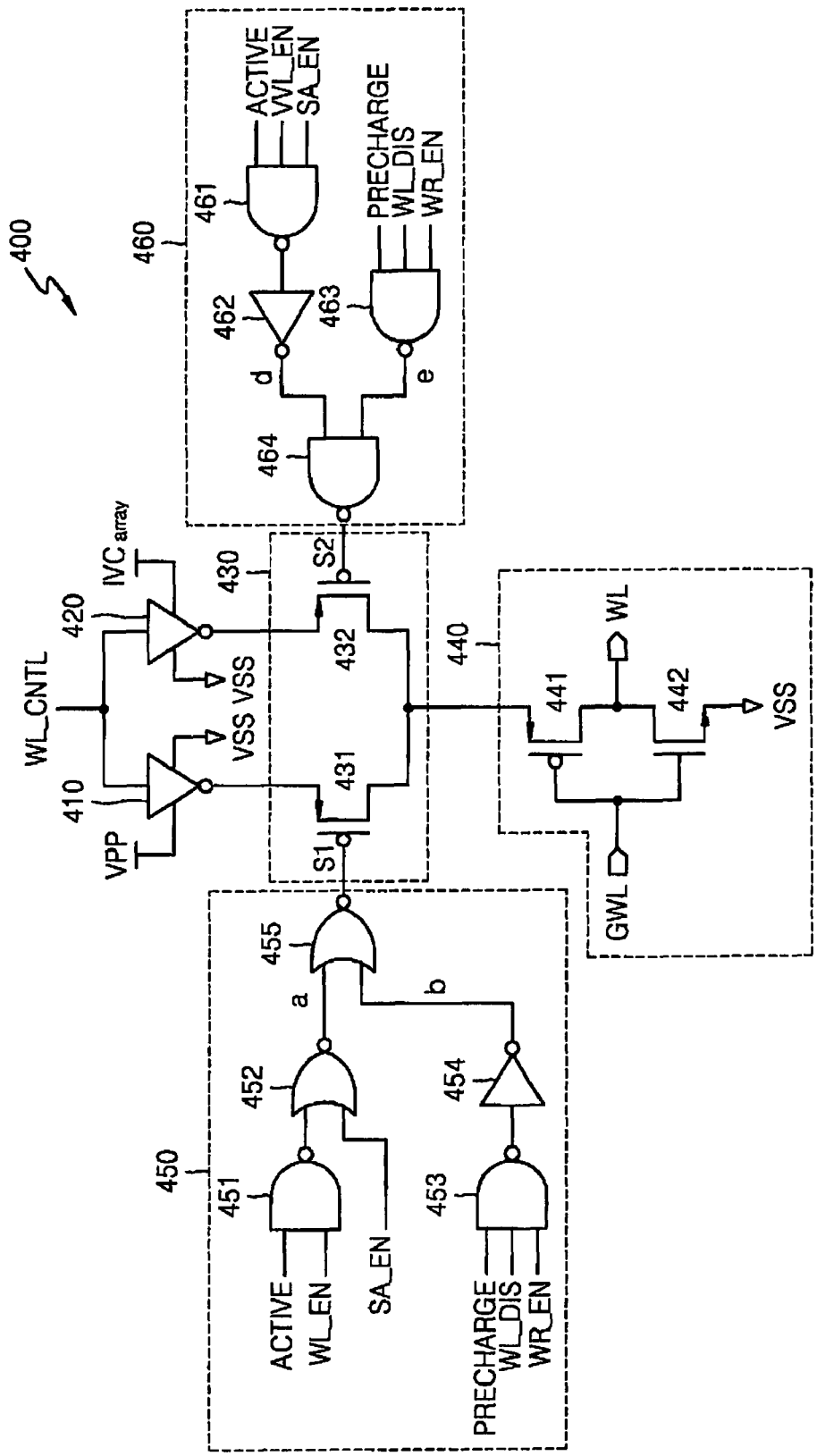
FIG. 4 is a circuit diagram illustrating a word line driving circuit, according to an exemplary embodiment of the present invention.

FIG. 4 is circuit diagram showing a word line driving circuit 400, according to another exemplary embodiment of the present invention. Referring to FIG. 4, the word line driving circuit 400 includes a first power driver 410, a second power driver 420, a switching unit 430, a word line driver 440, a first switching signal generator 450, and a second switching signal generator 460.

The first power driver 410 includes an inverter that outputs a boosting voltage VPP or a ground voltage VSS in response to a word line control signal WL_CNTL. The second driver 420 includes an inverter that outputs an internal power voltage $IVC_{array}$ or the ground voltage VSS in response to the word line control signal WL_CNTL. The word line control signal WL_CNTL controls the word line WL to be enabled or disabled.

The switching unit 430 includes a first PMOS transistor 431 that transfers an output of the first power driver 410 to the word line driver 440 in response to a first switching signal S1, and a second PMOS transistor 432 that transfers an output of the second power driver 420 to the word line driver 440 in response to a second switching signal S2. The first switching signal generator 450 and the second switching signal generator 460 provide the first switching signal S1 and the second switching signal S2, respectively.

The word line driver 440 drives the word line WL in response to a word line driving signal GWL using output power transferred from the switching unit 430. The word line driver 440 includes a PMOS transistor 441 and an NMOS transistor 442 that are connected in serial to each other between the output of the switching unit 430 and the ground voltage VSS. The PMOS transistor 441 and the NMOS transistor 442 respectively include gates connected to the word line driving signal GWL and drains connected to the word line WL.

The first switching signal generator 450 includes a first NAND gate 451 that inputs an active signal ACTIVE and a word line enable signal WL_EN; a first NOR gate 452 that inputs an output of the first NAND gate 451 and a sense amplifier (AMP) enable signal SA_EN; and a second NAND gate 453 that inputs a pre-charge signal PRECHARGE, a word line disable signal WL_DIS and a write enable signal WR_EN. The first switching signal generator 450 further includes an inverter 454 that inputs an output of the second NAND gate 453, and a second NOR gate 455 that inputs outputs of the first NOR gate 452 and the inverter 454 and outputs the first switching signal S1.

The second switching signal generator 460 includes a first NAND gate 461 that inputs the active signal ACTIVE, the word line enable signal WL_EN and the sense AMP enable signal SA_EN; an inverter 462 that inputs an output of the first NAND gate 461; and a second NAND gate 463 that inputs the pre-charge signal PRECHARGE, the word line disable signal WL_DIS and the write enable signal WR_EN. The second switching signal generator 460 further includes a third NAND gate 464 that inputs outputs of the inverter 462 and the second NAND gate 463 and outputs the second switching signal S2.

Operation of the word line driving circuit 400 is described with reference to FIG. 5, which is a timing diagram illustrating an exemplary embodiment of the present invention. The word line control signal WL_CNTL is preset to a logic low level, so that the output of the first power driver 410 is a boosting voltage level VPP and the output of the second power driver 420 is an internal power voltage $IVC_{array}$.

Figure 5:
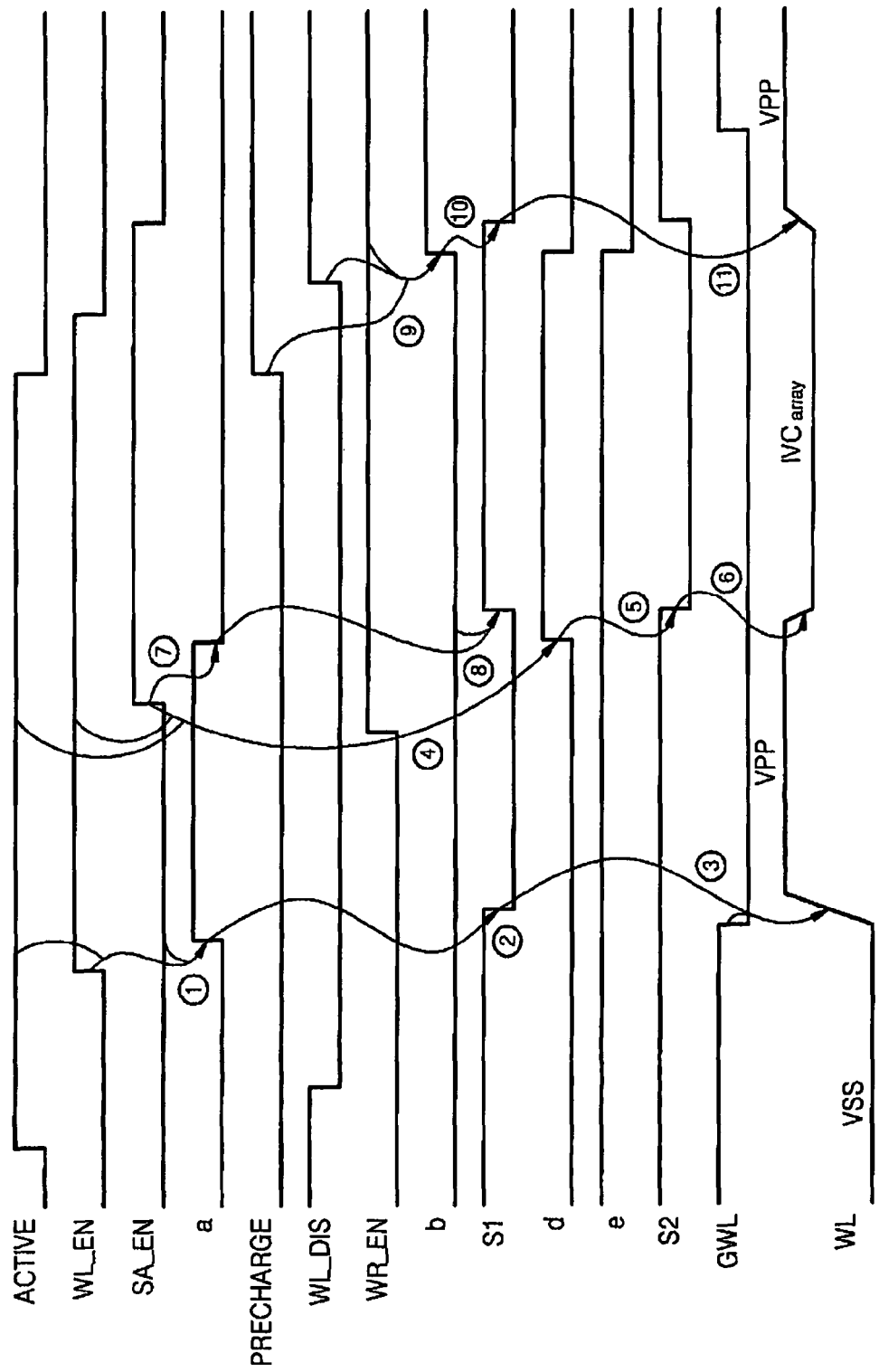
FIG. 5 is a timing diagram of the word line driving circuit illustrated in FIG. 4, according to an exemplary embodiment of the present invention.

Referring to FIG. 5, an output "a" of the first NOR gate 452 has a logic high level in response to the active signal ACTIVE having a logic high level, the word line enable signal WL_EN having a logic high level, and the sense AMP enable signal SA_EN having a logic low level (①). The first switching signal S1 has a logic low level in response to the output "a" of the first NOR gate 452 having a logic high level (②). The boosting voltage level VPP is applied to the word line WL in response to the first switching signal S1 and the word line driving signal GWL having the logic low level (③).

The output "d" of the inverter 462 has a logic high level in response to the active signal ACTIVE having the logic high level, the word line enable signal WL_EN having the logic high level, and the sense AMP enable signal SA_EN having a logic high level (④). The second switching signal S2 has a logic low level in response to the output "d" of the inverter 462 having the logic high level and the output "e" of the second NAND gate 463 (⑤). The internal power voltage $IVC_{array}$ is applied to the word line WL in response to the second switching signal S2 and the word line driving signal GWL having the logic low level (⑥).

At the same time, the output node "a" of the first NOR gate 452 changes to having a logic low level in response to the active signal ACTIVE having the logic high level, the word line enable signal WL_EN having the logic high level, and the sense AMP enable signal SA_EN having a logic high level (⑦). The first switching signal S1 has a logic high level in response to the output "a" of the first NOR gate 452 and the output "b" of the inverter 454 having the logic low level (⑧). The first PMOS transistor 431 is turned off in response to the first switching signal S1 having the logic high level.

Thereafter, the output "b" of the inverter 454 changes to have a logic high level in response to the pre-charge signal PRECHARGE having a logic high level, the word line disable signal WL_DIS having a logic high level, and the write enable signal WR_EN having a logic high level (⑨). The first switching signal S1 has a logic low level in response to the output "b" of the inverter 454 having the logic high level (⑩). The boosting voltage level VPP is applied to the word line WL in response to the first switching signal S1 and the word line driving signal GWL having the logic low level (⑪). At the same time, the second switching signal S2 changes to have the logic high level, based on the output "e" of the second NAND gate 463 having a logic low level, so that the second PMOS transistor 432 is turned off.

The word line driving circuit 400 of the present embodiment sequentially drives the word line WL to the boosting voltage level VPP, the internal power voltage $IVC_{array}$, and boosting voltage level VPP during a word line WL enable period in the same manner as the illustrative word line driving method illustrated in FIGS. 2 and 3.

The present invention drives a word line sequentially having a boosting voltage level and an internal power voltage level during a word line enable period, which results in reduction of word line stress, thereby increasing long-term reliability of a memory device.

While the present invention has been particularly shown and described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of driving a word line connected to memory cells, comprising:
   enabling the word line to a boosting voltage level during a first period of a word line enable period; and
   enabling the word line to an internal power voltage level during a second period of the word line enable period.

2. The method of claim 1, wherein the word line is enabled and data is re-stored in the memory cells during the first period of the word line enable period.

3. The method of claim 1, further comprising:
   enabling the word line to the boosting voltage level during a third period of the word line enable period.

4. The method of claim 1, further comprising:
   applying a ground voltage level to the word line during a word line disable period.

5. The method of claim 1, wherein the boosting voltage comprises the sum of the internal power voltage and a threshold voltage of the memory cells.

6. The method of claim 1, wherein the internal power voltage is used to drive array blocks in which the memory cells are arranged.

7. The method of claim 3, wherein the second period of the word line enable period is between the first period of the word line enable period and the third period of the word line enable period.

8. A word line driving circuit comprising:
   a first power driver driven to a boosting voltage level;
   a second power driver driven to an internal power voltage level;
   a switching unit for transferring a first output of the first power driver to a word line driver in response to a first switching signal and for transferring a second output of the second power driver to the word line driver in response to a second switching signal;
   the word line driver for alternately driving a word line to the first output and the second output transferred from the switching unit in response to a word line driving signal; and
   a first switching signal generator and a second switching signal generator for respectively generating the first switching signal and the second switching signal in response to an active signal, a word line enable signal, a sense AMP enable signal, a pre-charge signal, a word line disable signal, and a write enable signal.

9. The word line driving circuit of claim 8, wherein the first power driver comprises an inverter connected between a boosting voltage source and a ground voltage.

10. The word line driving circuit of claim 8, wherein the second power driver comprises an inverter connected between an internal power voltage source and a ground voltage.

11. The word line driving circuit of claim 8, wherein the switching unit comprises:
    a first PMOS transistor connected between the first power driver and the word line driver and having a gate connected to the first switching signal; and
    a second PMOS transistor connected between the second power driver and the word line driver and having a gate connected to the second switching signal.

12. The word line driving circuit of claim 8, wherein the first switching signal generator comprises:
    a first NAND gate for inputting the active signal and the word line enable signal;
    a first NOR gate for inputting an output of the first NAND gate and the sense AMP enable signal;
    a second NAND gate for inputting the pre-charge signal, the word line disable signal, and the write enable signal;
    an inverter for inputting an output of the second NAND gate; and
    a second NOR gate for inputting outputs of the first NOR gate and the inverter and outputting the first switching signal.

13. The word line driving circuit of claim 8, wherein the second switching signal generator comprises:
    a first NAND gate for inputting the active signal, the word line enable signal, and the sense AMP enable signal;
    an inverter for inputting an output of the first NAND gate;
    a second NAND gate for inputting the pre-charge signal, the word line disable signal, and the write enable signal; and
    a third NAND gate for inputting outputs of the inverter and the second NAND gate and outputting the second switching signal.

14. The word line driving circuit of claim 8, wherein the word line driver comprises:
    a PMOS transistor comprising a gate connected to the word line driving signal, a source connected to an output of the switching unit, and a drain connected to the word line; and
    an NMOS transistor comprising a gate connected to the word line driving signal, a source connected to a ground voltage, and a drain connected to the word line.

* * * * *